United States Patent
Park et al.

(10) Patent No.: US 8,853,560 B2
(45) Date of Patent: Oct. 7, 2014

(54) ELECTROMAGNETIC BANDGAP STRUCTURE AND PRINTED CIRCUIT BOARD

(75) Inventors: Dae-Hyun Park, Ulsan (KR); Han Kim, Yongin-si (KR); Mi-Ja Han, Jeonju-si (KR); Ja-Bu Koo, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 96 days.

(21) Appl. No.: 13/411,005

(22) Filed: Mar. 2, 2012

(65) Prior Publication Data

US 2012/0162934 A1 Jun. 28, 2012

Related U.S. Application Data

(62) Division of application No. 12/010,437, filed on Jan. 24, 2008, now Pat. No. 8,153,907.

(30) Foreign Application Priority Data

Apr. 30, 2007 (KR) ........................ 10-2007-0041993

(51) Int. Cl.
*H05K 1/11* (2006.01)
*H05K 1/02* (2006.01)

(52) U.S. Cl.
CPC .... *H05K 1/0236* (2013.01); *H05K 2201/09618* (2013.01); *H05K 2201/09718* (2013.01); *H05K 2201/09781* (2013.01); *H05K 1/115* (2013.01); *H05K 2201/09536* (2013.01); *H05K 1/0222* (2013.01); *H05K 1/0219* (2013.01); *H05K 2201/09309* (2013.01)
USPC ..... 174/261; 174/255; 361/301.4; 361/306.3; 361/794; 343/700 MS; 343/824; 343/909; 257/533; 257/665; 257/686

(58) Field of Classification Search
CPC .......... H05K 1/11; H01L 21/02; H01L 23/48; H01L 23/58; H01L 23/62; H01L 23/367; H01L 23/498; H01L 29/00; H01G 4/228; H01G 4/236; H01Q 15/24
USPC ............ 174/261, 255; 361/301.4, 306.3, 794; 343/700 MS, 824, 909; 257/533, 665, 257/686
See application file for complete search history.

(56) References Cited

U.S. PATENT DOCUMENTS 5,347,712 A 9/1994 Yasuda et al.
5,786,979 A * 7/1998 Douglass ...................... 361/328

(Continued)

FOREIGN PATENT DOCUMENTS

JP 2003-133801 5/2003

OTHER PUBLICATIONS

Korean Patent Office Action, mailed Mar. 18, 2008 and issued in corresponding Korean Patent Application No. 10-2007-0041993.

(Continued)

*Primary Examiner* — Xiaoliang Chen

(57) ABSTRACT

An electromagnetic bandgap structure and a printed circuit board that solve a mixed signal problem are disclosed. In accordance with embodiments of the present invention, the electromagnetic bandgap structure includes a first metal layer; a first dielectric layer, stacked in the first metal layer; a second metal layer, stacked in the first dielectric layer, and having a holed formed at a position of the second dielectric layer; a second dielectric layer, stacked in the second metal layer; a metal plate, stacked in the second dielectric layer; a first via, penetrating the hole formed in the second metal layer and connecting the first metal layer and the metal plate; a third dielectric layer, stacked in the metal plate and the second dielectric layer; a third metal layer, stacked in the third dielectric layer; and a second via, connecting the second metal layer to the third metal layer.

9 Claims, 18 Drawing Sheets

(56) References Cited

U.S. PATENT DOCUMENTS

| | | | |
|---|---|---|---|
| 6,100,118 A | 8/2000 | Shih et al. | |
| 6,353,189 B1* | 3/2002 | Shimada et al. | 174/255 |
| 6,353,540 B1* | 3/2002 | Akiba et al. | 361/794 |
| 6,483,481 B1* | 11/2002 | Sievenpiper et al. | 343/909 |
| 6,724,611 B1* | 4/2004 | Mosley | 361/306.3 |
| 2002/0085334 A1* | 7/2002 | Figueroa et al. | 361/301.4 |
| 2004/0095256 A1* | 5/2004 | Mohamadi | 340/870.18 |
| 2004/0095277 A1* | 5/2004 | Mohamadi | 343/700 MS |
| 2004/0095287 A1* | 5/2004 | Mohamadi | 343/824 |
| 2004/0100405 A1* | 5/2004 | Mohamadi | 343/700 MS |
| 2005/0029632 A1* | 2/2005 | McKinzie et al. | 257/665 |
| 2005/0116864 A1* | 6/2005 | Mohamadi | 343/700 MS |
| 2005/0161706 A1* | 7/2005 | Sutardja | 257/211 |
| 2005/0167811 A1* | 8/2005 | Frech et al. | 257/686 |
| 2006/0038639 A1* | 2/2006 | McKinzie, III | 333/219 |
| 2006/0044210 A1* | 3/2006 | Ramprasad et al. | 343/909 |
| 2006/0044211 A1* | 3/2006 | Ramprasad et al. | 343/909 |
| 2006/0175709 A1* | 8/2006 | Sutardja | 257/774 |
| 2007/0120223 A1* | 5/2007 | McKinzie et al. | 257/533 |
| 2007/0158105 A1* | 7/2007 | Kitao et al. | 174/261 |
| 2008/0079636 A1* | 4/2008 | Mohamadi | 343/700 MS |
| 2008/0185179 A1 | 8/2008 | Kim et al. | |
| 2008/0266018 A1 | 10/2008 | Han et al. | |
| 2008/0266026 A1 | 10/2008 | Han et al. | |
| 2009/0015354 A1 | 1/2009 | Kim et al. | |
| 2009/0071603 A1 | 3/2009 | Koo et al. | |
| 2009/0071709 A1 | 3/2009 | Han et al. | |
| 2009/0085691 A1 | 4/2009 | Kim et al. | |
| 2009/0145646 A1 | 6/2009 | Han et al. | |
| 2009/0184782 A1 | 7/2009 | Koo et al. | |
| 2009/0236141 A1 | 9/2009 | Kim et al. | |
| 2009/0322450 A1 | 12/2009 | Kim et al. | |
| 2010/0132996 A1 | 6/2010 | Han et al. | |
| 2010/0134200 A1 | 6/2010 | Koo et al. | |
| 2010/0134213 A1 | 6/2010 | Kim et al. | |

OTHER PUBLICATIONS

U.S. Patent Restriction Requirement mailed Sep. 10, 2010 in corresponding U.S. Appl. No. 12/010,437.

U.S. Patent Office Action mailed Oct. 29, 2010 in corresponding U.S Appl. No. 12/010,437.

U.S. Patent Final Office Action mailed Feb. 16, 2011 in corresponding U.S. Appl. No. 12/010,437.

U.S. Patent Advisory Action mailed May 21, 2011 in corresponding U.S. Appl. No. 12/010,437.

U.S. Patent Office Action mailed Aug. 9, 2011 in corresponding U.S. Appl. No. 12/010,437.

U.S. Patent Notice of Allowance mailed Dec. 2, 2011 in corresponding U.S. Appl. No. 12/010,437.

U.S. Appl. No. 12/010,437, filed Jan. 24, 2008, Dae-Hyun Park, Samsung Electro-Mechanics Co., Ltd.

* cited by examiner

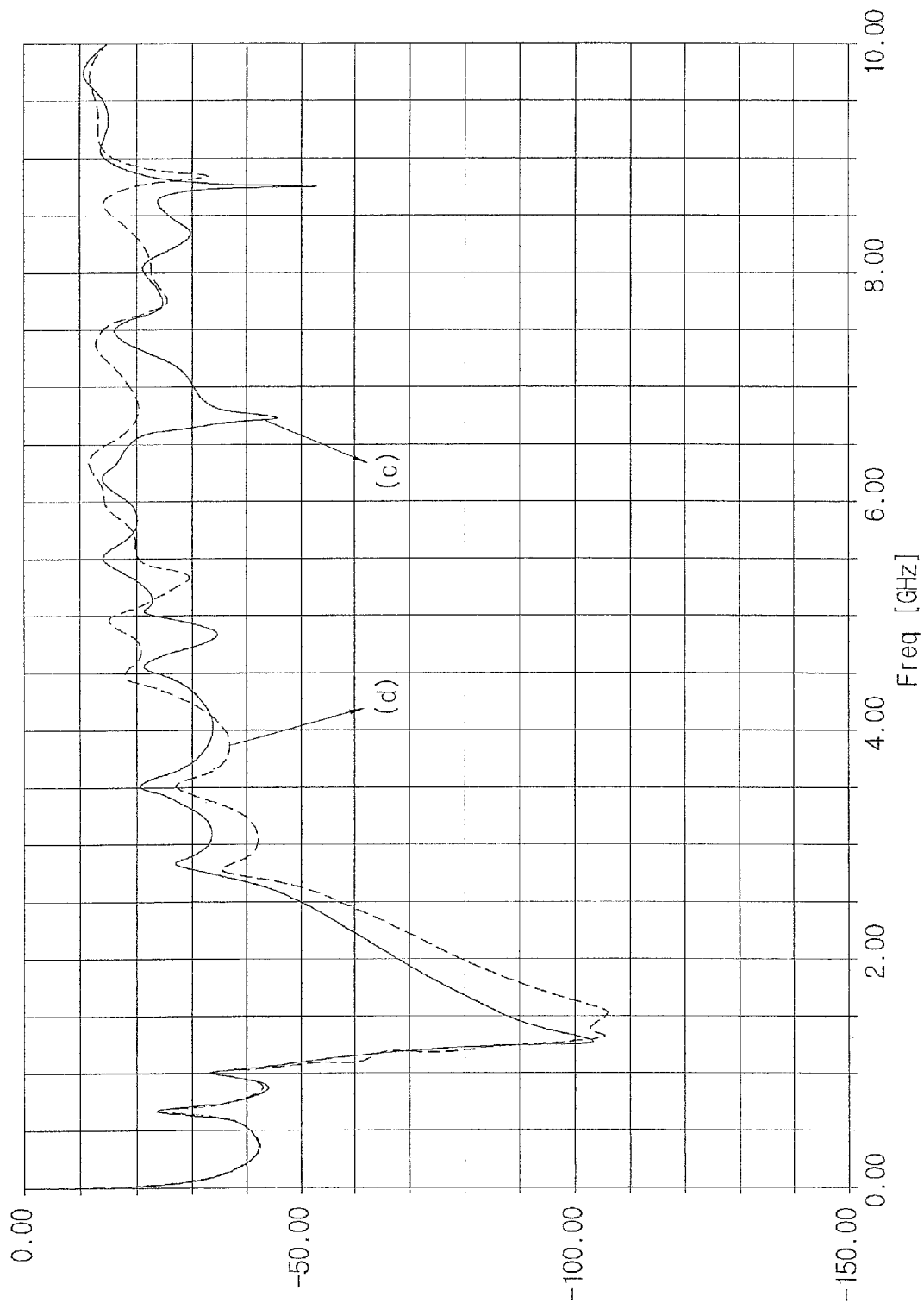

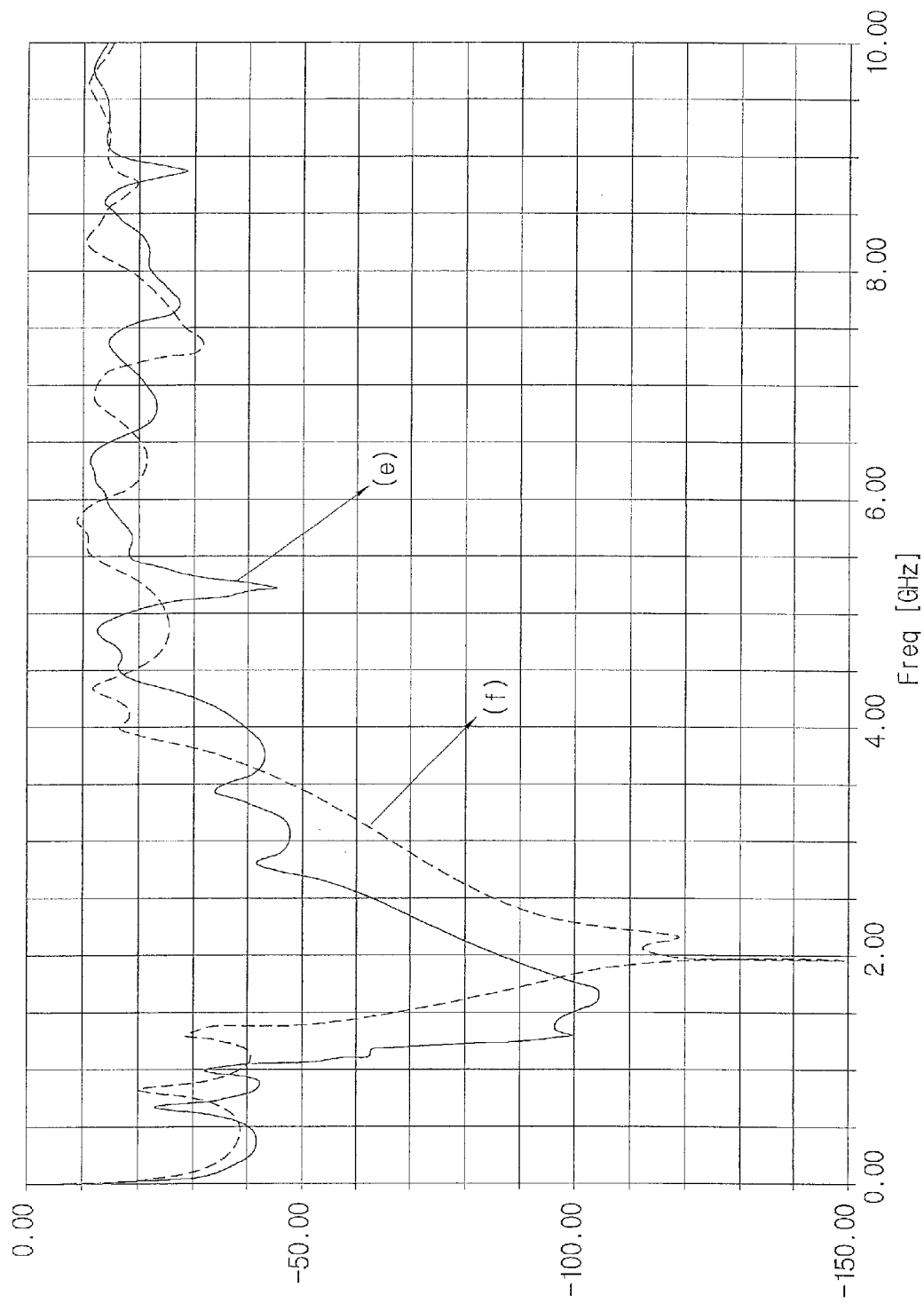

ELECTROMAGNETIC BANDGAP STRUCTURE AND PRINTED CIRCUIT BOARD

CROSS-REFERENCE TO RELATED APPLICATIONS

This application is a U.S. divisional application filed under 37 CFR 1.53(b) claiming priority benefit of U.S. patent application Ser. No. 12/010,437 filed in the United States on Jan. 24, 2008, now U.S. Pat. No. 8,153,907 which claims earlier priority benefit to Korean Patent Application No. 10-2007-0041993 filed with the Korean Intellectual Property Office on Apr. 30, 2007 the disclosures of which are incorporated herein by reference.

BACKGROUND

1. Field

The present invention relates to a printed circuit board, more specifically to a printed circuit board that can solve a mixed signal problem between an analog circuit and a digital circuit.

2. Description of the Related Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

FIG. 1 is a sectional view showing a printed circuit board including an analog circuit and a digital circuit. Although a 4-layered printed circuit board is illustrated, various printed circuit boards such as 2 and 6-layered printed circuit boards can be applied. Here, the analog circuit is assumed to be an RF circuit.

The printed circuit board 100 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140.

If it is assumed that the metal layer 110-2 is a ground layer and the metal layer 110-3 is a power layer, a current passes through a via 160 connected between the ground layer 110-2 and the power layer 110-3 and the printed circuit board 100 performs a predetermined operation or function.

Here, an operation frequency of the digital circuit 130 and an electromagnetic (EM) wave 150 by harmonics components are transferred to the RF circuit 140, to thereby generate a problem mixed signals. The mixed signal problem is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal ranging a certain frequency band, transferring the EM wave 150 including the signals ranging the certain frequency band from the digital circuit 130 may make it difficult to accurately receive the signal ranging the certain frequency band.

Solving the mixed signal problem becomes more difficult due to the increased complexity of electronic apparatuses and the higher operation frequency of the digital circuit 130.

The decoupling capacitor method, which is a typical solution for power noise, is not adequate for high frequencies. Accordingly, it is necessary to intercept or decrease the noise of the high frequencies between the RF circuit 140 and the digital circuit 130.

FIG. 2 is a sectional view showing an electromagnetic bandgap structure that solves a problem mixed signals between an analog circuit and a digital circuit in accordance with a conventional art, and FIG. 3 is a plan view showing a metal plate configuration of the electromagnetic bandgap structure shown in FIG. 2. FIG. 4 is a perspective view showing the electromagnetic bandgap structure shown in FIG. 2, and FIG. 5 is a schematic view showing an equivalent circuit of the electromagnetic bandgap structure shown in FIG. 2.

The electromagnetic bandgap structure 200 includes a first metal layer 210-1, a second metal layer 210-2, a first dielectric layer 220a a second dielectric layer 220b, a meal plate 232 and a via 234.

The first metal layer 210-1 and the metal plate 232 are connected to each other through the via 234. A mushroom type structure 230 is formed to include the metal plate 232 and the via 234 (refer to FIG. 4).

If the first meal layer 210-1 is a ground layer, the second metal layer 210-2 is a power layer. Also, if the first metal 210-1 is the power layer, the second layer 210-2 is the ground layer.

In other words, the repeated formation of the mushroom type structure 230 (refer to FIG. 3) results in a bandgap structure preventing a signal having a certain frequency band from being penetrated. At this time, the mushroom type structures 230, including the metal plates 232 and the vias 234, are repeatedly formed between the ground layer and the power layer.

The function preventing a signal having a certain frequency band from being penetrated, which is based on resistance $R_E$ and $R_P$, inductance $L_E$ and $L_P$, capacitance $C_E$, $C_P$ and $C_G$ and conductance $G_P$ and $G_E$, is approximated to the equivalent circuit shown in FIG. 5.

A mobile communication terminal is a good example for an electronic apparatus employing the board realized with the digital circuit and the RF circuit together. In the case of the mobile communication terminal, solving the problem mixed signals needs the noise shielding of an operation frequency band of the RF circuit between 0.8 and 2.0 GHz. The small sized mushroom type structure is also required. However, the foregoing electromagnetic bandgap structure may not satisfy the two conditions needed to solve the problem mixed signals.

Since the smaller sized mushroom type structure causes the bandgap frequency band shielding the noise to be increased, the mobile communication terminal is not effectively operated in the operation frequency band of the RF circuit between 0.8 and 2.0 GHz.

SUMMARY

Accordingly, the present invention provides an electromagnetic bandgap structure and a printed circuit board that can allow the size not to be increased and have a low bandgap frequency band.

The present invention also provides an electromagnetic bandgap structure and a printed circuit board that can solve a problem mixed signals in an electronic apparatus (e.g. a mobile communication terminal) employing the board having the digital circuit and the RF circuit, realized therein together.

In addition, the present invention provides an electromagnetic bandgap structure and a printed circuit board that can allow the noise having a certain frequency band not to penetrate it.

An aspect of present invention features an electromagnetic bandgap structure including a first metal layer; a first dielectric layer, stacked in the first metal layer; a second metal layer, stacked in the first dielectric layer and having a hole formed at a predetermined position; a second dielectric layer, stacked in the second metal layer; a metal plate, stacked in the second dielectric layer; a first via, penetrating the hole formed in the second metal layer and connecting the first metal layer and the metal plate; a third dielectric layer, stacked in the metal plate and the second dielectric layer; a third metal layer, stacked in the third dielectric layer; and a second via, connecting the second metal layer to the third metal layer.

Here, the second via can connect the second metal layer to the third metal layer through an area excluding the area in which the metal plate is stacked.

A plurality of second vias can be formed. Here, the plurality of second vias can be symmetrically formed based on the first via as a reference axis.

The first via can be formed to have an identical center axis to the hole. Here, a diameter of the hole can be set to be larger than that of the first via A plurality of mushroom type structures including the metal plates and the first vias can be placed between the first metal layer and the third metal layer. Here, a plurality of holes can be formed in the second metal layer, according to a position of each first vias of the mushroom type structures.

The plurality of holes can be formed to be away from each other at regular intervals.

The metal layers of the plurality of mushroom type structures can be placed on a same planar surface.

The third dielectric layer can be formed by using an identical dielectric material to the second dielectric layer.

Another aspect of the present invention features a printed circuit board having an analog circuit and a digital circuit. Here, the printed circuit board can include an electromagnetic bandgap structure which is disposed between the analog circuit and the digital circuit, the electromagnetic bandgap structure including a first metal layer; a first dielectric layer, stacked in the first metal layer; a second metal layer, stacked in the first dielectric layer, and having a hole formed at a predetermined position; a second dielectric layer, stacked in the second metal layer; a metal plate, stacked in the second dielectric layer; a first via, penetrating the hole formed in the second metal layer and connecting the first metal layer and the metal plate; a third dielectric layer, stacked in the metal plate and the second dielectric layer; a third metal layer, stacked in the third dielectric layer; and a second via, connecting the second metal layer to the third metal layer.

Here, the first metal layer can be any one of a ground layer and a power layer, and the second metal layer and the third metal layer can be the other.

The second via can connect the second metal layer to the third metal layer through an area excluding the area in which the metal plate is stacked.

A plurality of second vias can be formed. Here, the plurality of second vias can be symmetrically formed based on the first via as a reference axis.

The first via can be formed to have an identical center axis to the hole. Here, a diameter of the hole can be set to be larger than that of the first via.

A plurality of mushroom type structures including the metal plates and the first vias can be placed between the first metal layer and the third metal layer. Here, a plurality of holes can be formed in the second metal layer, according to a position of each first via of the mushroom type structures.

The plurality of holes can be formed to be away from each other at regular intervals.

The metal layers of the plurality of mushroom type structures can be placed on a same planar surface.

The third dielectric layer can be formed by using an identical dielectric material to the second dielectric layer.

The analog circuit can be an RF circuit receiving a wireless signal from an outside.

BRIEF DESCRIPTION OF THE DRAWINGS

These and other features, aspects and advantages of the present invention will become better understood with regard to the following description, appended Claims and accompanying drawings where:

Figure 6:
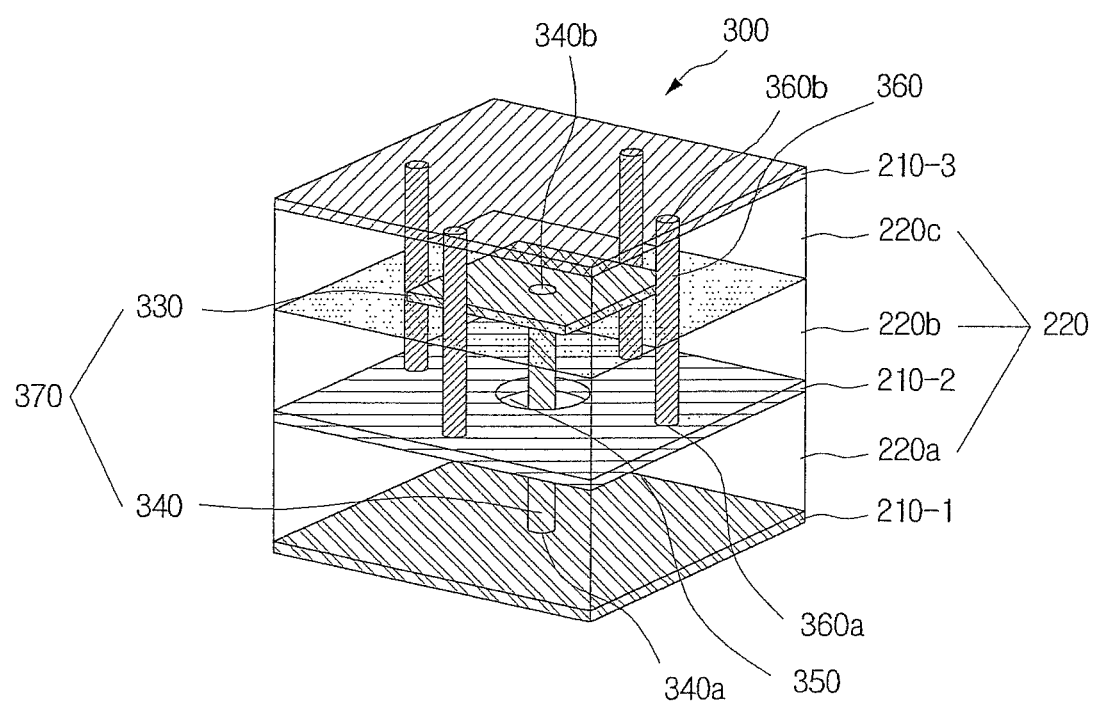
FIG. 6 is a perspective view showing an electromagnetic bandgap structure which solves a mixed signal problem between an analog circuit and a digital circuit.
Figure 7:
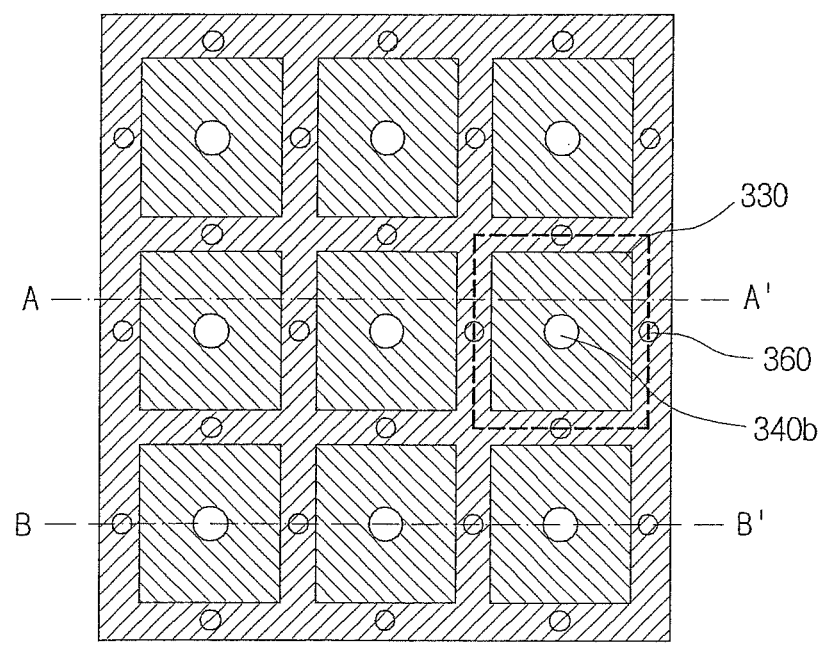
Figure 8:
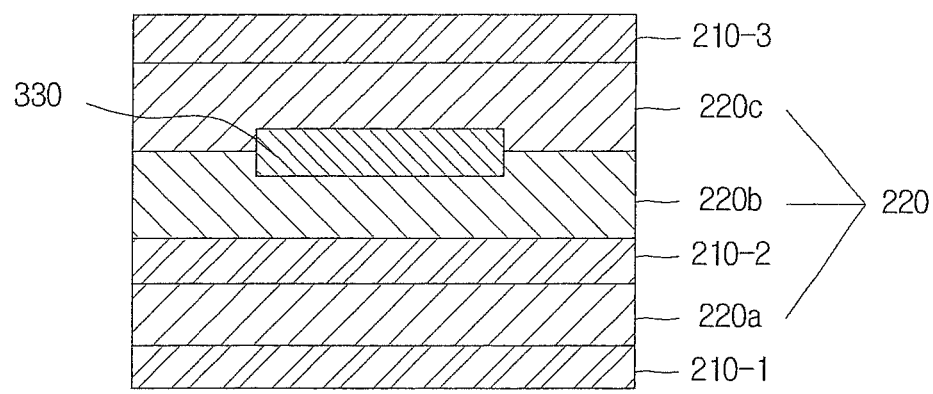
Figure 9:
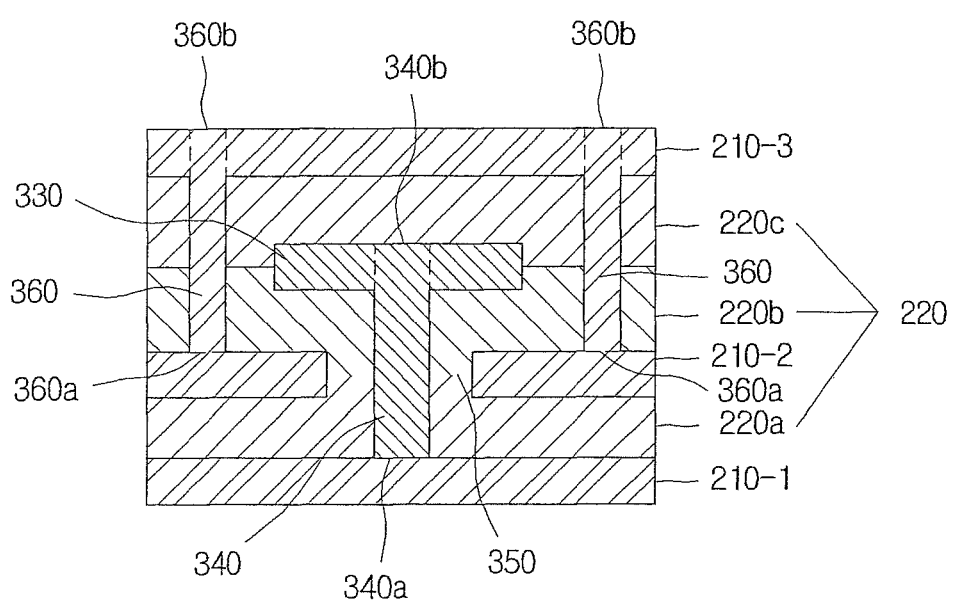
Figure 10:
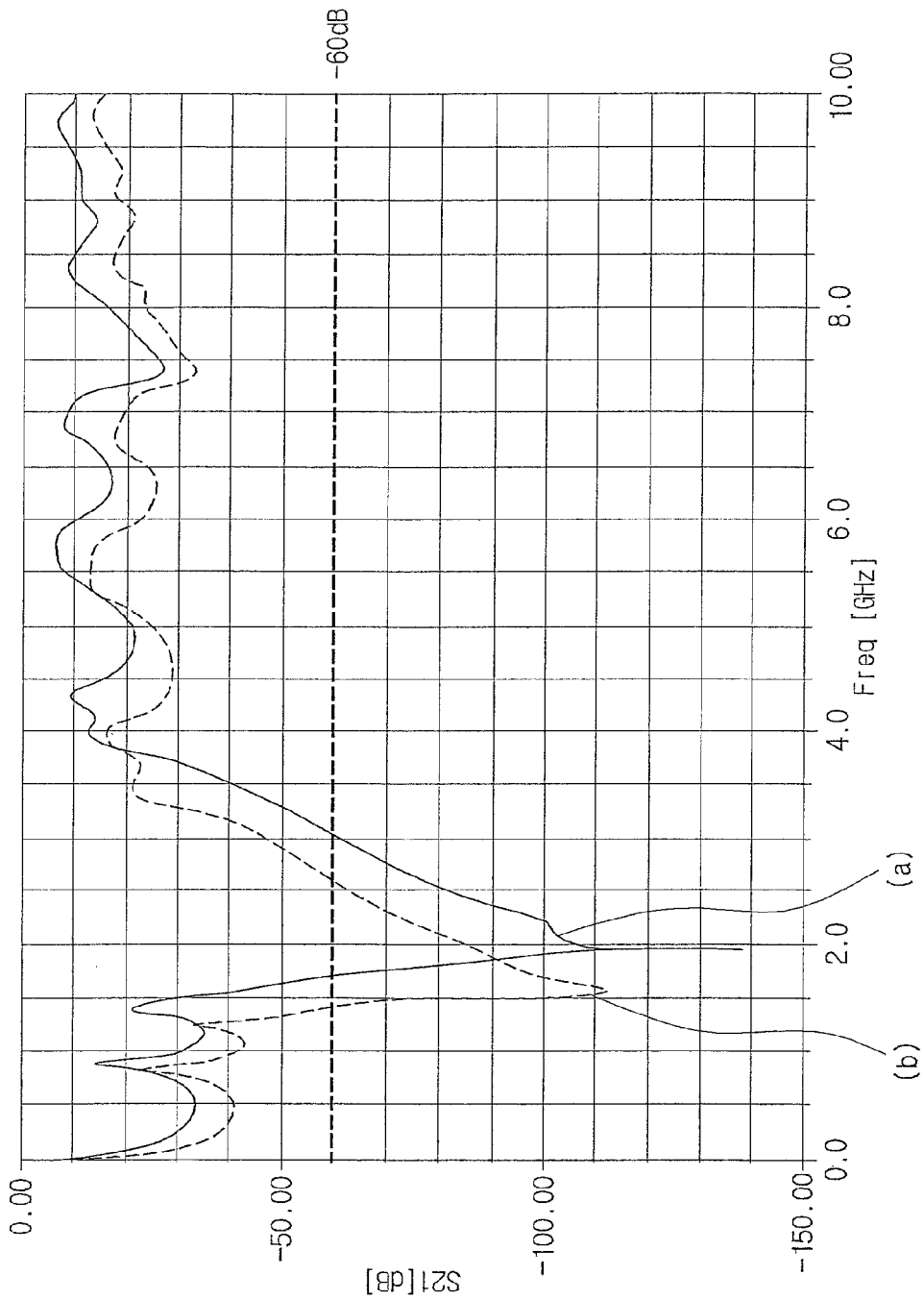
Figure 11A:
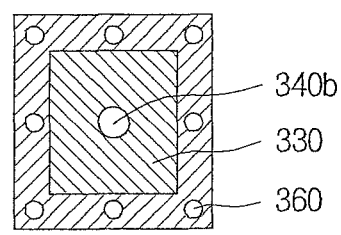
Figure 11B:
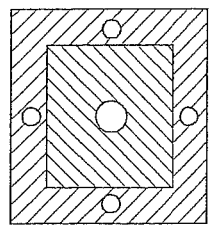
Figure 11C:
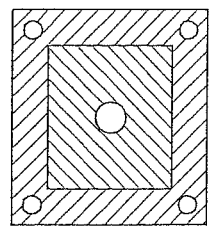
Figure 11D:
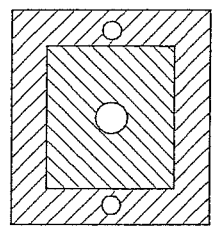
Figure 11E:
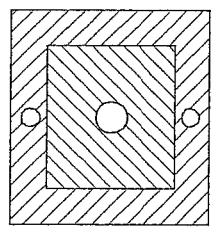
Figure 12A:
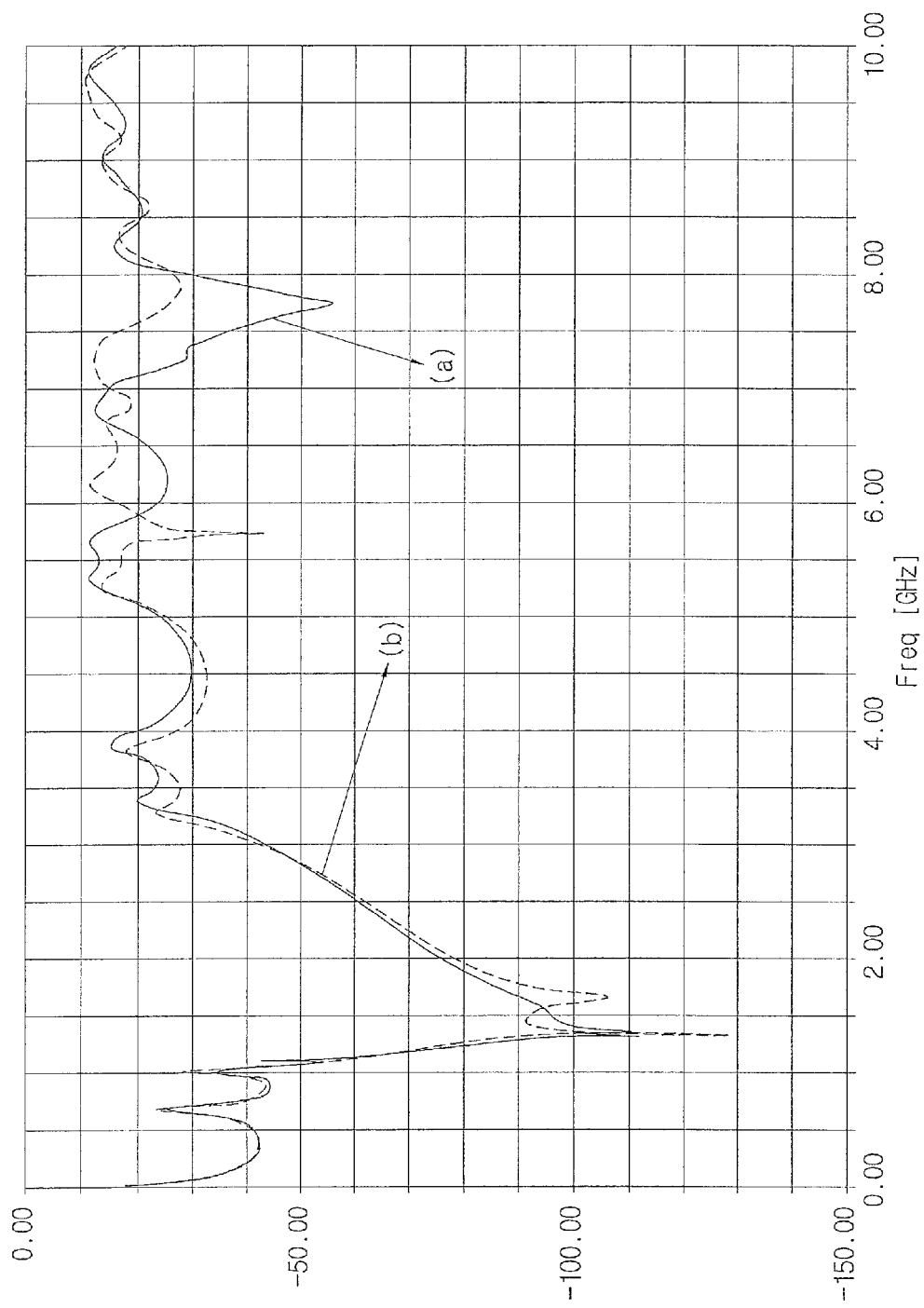

FIG. is a plan view showing a metal plate configuration of the electromagnetic bandgap structure shown in FIG. 6;

FIG. 8 is a sectional view showing an electromagnetic bandgap structure of the present invention according to the A-A' line of FIG. 7;

FIG. 9 is another sectional view showing an electromagnetic bandgap structure of the present invention according to the B-B' line of FIG. 7;

FIG. 10 is graphs showing results that are computer-simulated by using electromagnetic bandgap structures in accordance with a conventional art and an embodiment of the present invention;

FIG. 11A through FIG. 11E illustrate various configuration types of a second via connecting a second metal layer to a third metal layer in an electromagnetic bandgap structure; and FIG. 12A through FIG. 12C are graphs showing results that are computer-simulated by using electromagnetic bandgap structures in accordance with a conventional art and an embodiment of the present invention according to each configuration type of the second via shown in FIG. 11A through FIG. 11E.

DESCRIPTION OF EMBODIMENTS

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings.

FIG. 6 is a perspective view showing an electromagnetic bandgap structure which solves a mixed signal problem between an analog circuit and a digital circuit, and FIG. is a plan view showing a metal plate configuration of the electromagnetic bandgap structure shown in FIG. 6. FIG. 8 is a sectional view showing an electromagnetic bandgap structure of the present invention according to the A-A' line of FIG. 7, and FIG. 9 is another sectional view showing an electromagnetic bandgap structure of the present invention according to the B-B' line of FIG. 7.

Referring to FIG. 6 though FIG. 9, the electromagnetic bandgap structure 300 in accordance with an embodiment of the present invention can include a first metal layer 210-1, a second metal layer 210-2, having a hole 350 formed at a predetermined position, a third metal layer 210-3, a first dielectric layer 220a, a second dielectric layer 220b, a third dielectric layer 220c, a metal plate 330, a first via 340 and a second via 360.

In other words, the first dielectric layer 220a can be stacked in the first metal layer 210-1, and the second metal layer 210-2 can be stacked in the first dielectric layer 220a. The second dielectric layer 220b can be stacked in the second metal layer 210-2, and the metal plate 330 can be stacked in the second dielectric layer 220b. The first metal layer 210-1 and the metal plate 330 can be connected to each other through the first via 340 penetrating the hole 350, formed in the second metal layer 210-2. The third dielectric layer 220c can be stacked in the metal plate 330 and the second dielectric layer 220b, and the third metal layer 210-3 can be stacked in the third dielectric layer 220c. The second metal layer 210-2 and the third metal layer 210-3 can be connected to each other through the second via 360. Here, the metal plate 330 and the first via 340 can be arranged in a mushroom form between the first metal layer 2210-1 and the third metal layer 210-3 (which is referred to as a mushroom type structure 370). Each of the elements will be described as follows.

The first metal layer 210-1, the second metal layer 210-2 and the third metal layer 210-3 can be used as means for connecting an electrical power. For example, if the first metal layer 210-1 is a ground layer, the third metal layer 210-3 (including the second metal layer 210-2, connected to the third metal layer 210-3 through the second via 360, and the same shall apply hereinafter.) can be a power layer. If the first metal layer 210-1 is the power layer, the third metal layer 210-3 can be the ground layer. In other words, the first metal layer 210-1 and the third metal layer 210-3 can be each one of the ground layer and the power layer, which are placed close to each other, and the dielectric layer 220 can be placed between the ground layer and the power layer. Accordingly, it is natural that any metal material capable of being provided with the power and transferring an electrical signal can be used without any limitation. The same can be applied to the metal plate 330, the first via 340 and the second via 360, which are described below.

The dielectric layer 220 can be formed between the first metal layer 210-1 and the second metal layer 210-2 and between the second metal layer 210-2 and the third metal layer 210-3. The dielectric layer 220 can be distinguished into the first dielectric layer 220a, the second dielectric layer 220b and the third dielectric layer 220c according to their formation time. At this time, the second metal layer 210-2 can be placed between the first dielectric layer 220a and the second dielectric layer 220b, and the metal layer 210-3 can be placed between the second dielectric layer 220b and the third dielectric layer 220c. Here, the first dielectric layer 220a, the second dielectric layer 220b and the third dielectric layer 220c, respectively, can consist of materials having different dielectric constants, but alternatively, at least one dielectric layer can consist of materials having the same dielectric constant.

For example, the second dielectric layer 220b and the third dielectric layer 220c can be formed by using the same dielectric material for the convenience of the stacking process and the adjustment of the bandgap frequency. As such, selecting or adjusting the dielectric material (i.e. the corresponding dielectric constant) included in each dielectric layer adequately can make it possible to approach a desired bandgap frequency band (i.e. between 0.8 and 2.0 GHz) in accordance with the present invention. Of course, each stacked thickness of the three dielectric layers 220a, 220b and 220c can also be adequately adjusted to approach the desired bandgap frequency band.

For example, even though the electromagnetic bandgap structures 300 have the same size, the corresponding bandgap frequency band can approach the desired frequency band by largely decreasing the stacked thickness of the third dielectric layer 220c and increasing the stacked thickness of the first dielectric layer 220a or the second dielectric layer 220b as much as the stacked thickness of the third dielectric layer 220c is decreased. Here, the bandgap frequency can refer to the frequency prevented from being transferred among the electromagnetic wave transferred from one side to the other side.

The first via 340 can connect the first metal layer 210-1 and the metal plate 330 by penetrating the hole 350 formed in the second metal layer 210-2. Accordingly, the process removing a part of the second metal layer 210-2 to form the hole 350 can performed before the first via 340 is formed. For example, the hole 350 can be formed at a position in the second metal layer 210-2 by using the below-described drilling process. Then, the second via 345 penetrating the hole 350 can be formed. At this time, the process forming the hole 350 can be performed after or before the second dielectric layer 220b is stacked in the second metal layer 210-2. Hereinafter, the method of forming the first via 340 will be described taking an example.

The first metal layer 210-1, the first dielectric layer 220a, the second metal layer 210-2, the second dielectric layer 220b and the metal plate 330 can be successively stacked in. Then, a via land (not shown) can be formed at a position in the metal plate 330. Here, the position of the metal plate 330 can be the position in which the first via 340 is desired to be formed for being electrically connected to the first metal layer 210-1. The via land, which is to reduce the position error in the drilling process for forming the first via 340, can be formed more largely than the sectional area size of the first via 340.

Then, through the drilling process, the via can be formed to penetrate the via land, the dielectric layer 220b, the hole 350 formed on the second metal layer 210-2 and the first dielectric layer 2202a. After the via is formed, the plating process can be performed to allow a plating layer to be formed on the internal wall of the via in order to electrically connect the first metal layer 210-1 to the metal plate 330. According to the plating process, a plating layer can be formed on the internal wall of the via excluding the center part among the inside part of the via or the entire inside part of the via can be completely filled. In case that the inside part of the via has an empty center part, the empty center part can be filled with the dielectric material or air. Through the foregoing processes, the first via 340 can have one end part 340a, connected to the first metal layer 210-1, and the other end part 340b, connected to the metal plate 330.

Here, the first via 340 can be formed to have the same axis as the hole 30 in order to penetrate the hole 350 formed in the second metal layer 210-2 and connecting the first metal layer 210-1 to the metal plate 330. Similarly, the hole 350 formed in the second metal layer 210-2 can have a larger diameter than the first via 340 in order to allow the first via 340 to penetrate the hole 350 formed in the second metal layer 210-2 and to connect the first metal layer 210-1 and the metal plate 330.

Although FIG. 6 through FIG. 9 illustrate the mushroom type structure 370 in which one first via 340 is connected to one metal plate 330 as an example, a plurality of first vias 340 can be connected to one metal plate 330. Also, even though FIG. 6 and FIG. 7 illustrate the metal plate 330 having a regular square shape, the metal plate 330 can have various shapes such as polygons, for example, triangles and hexagons, circles and ellipses. Below are described the mushroom type structure 370 with reference to FIG. 6 through FIG. 9.

At least one mushroom type structure 370 having the metal plate 330 and the first via 340 can be arranged between the first metal layer 210-1 and the third metal layer 210-3. At this time, the metal plate 330 of the mushroom type structure 370 can be arranged on the same planar surface or the different planar surface between the first metal layer 210-1 and the third metal layer 210-3. Even if FIG. 6 through FIG. 9 illustrate that the first via 340 of the mushroom type structure 370 is connected to the first metal layer 210-1, the first via 340 can be connected to the third metal layer 210-3.

Also, a plurality of mushroom type structures 370 can be connected to the first metal layer 210-1 or the third metal layer 210-3 through the first via 340. Alternatively, some of the plurality of mushroom type structures can be connected to the first metal layer 210-1 and the other can be connected to the third metal layer 210-3.

FIG. 7 illustrates that the mushroom type structures 370 can be away from each other at predetermined intervals and be repeatedly arranged. The repeated formation of the mushroom type structures 370 can make it possible to block a signal having a frequency band corresponding to an operation frequency band of an analog circuit (e.g. an RF circuit) among an electromagnetic wave proceeding from a digital circuit to the analog circuit. For this, the second metal layer 210-2 can form a plurality of holes 350, and the mushroom type structures 370 can be arranged one by one at a position corresponding to a position in which each hole 350 is formed. At this time, the metal plates 330 of the plurality of arranged mushroom type structures can be arranged on the same or different planar surface. Also, the plurality of holes 350 can be away from each other in regular intervals and be formed on the second metal layer 210-2.

The second via 360 can connect the second metal layer 210-2 to the third metal layer 210-3. The second via 360 can be formed through the similar processes to the aforementioned processes of forming the first via 340. Through the processes, the second via 360 can have one end part 360a, which is connected to the second metal layer 210-2, and the other end part 360b, which is connected to the third metal layer 210-3. Here, since the second via 360 is for the electric connection between the second metal layer 210-2 and the third metal layer 210-3, the second via 360 can be required to be disconnected to the metal plate 330. Accordingly, the second via 360 can be formed by penetrating an area of an upper surface of the second dielectric layer 220b. In the electromagnetic bandgap structure 300, a plurality of second vias 360 connecting the second metal layer 210-2 to the third metal layer 210-3 can be also formed. At this time, the plurality of second vias 360 can be symmetrically formed based on the first via 340 as a reference axis as illustrated in FIG. 6 and FIG. 7.

Although FIG. 6 through FIG. 9 are related to the case that the second via 360 connects the second metal layer 210-2 to the third metal layer 210-3, the second via 360 can be formed to connect the first metal layer 210-1 to the second metal layer 210-2. In this case, the first metal layer 210-1 and the second metal layer 210-2 can function as one of the power layer and the ground layer, and the third metal layer 210-3 can function as the other.

Figure 4:
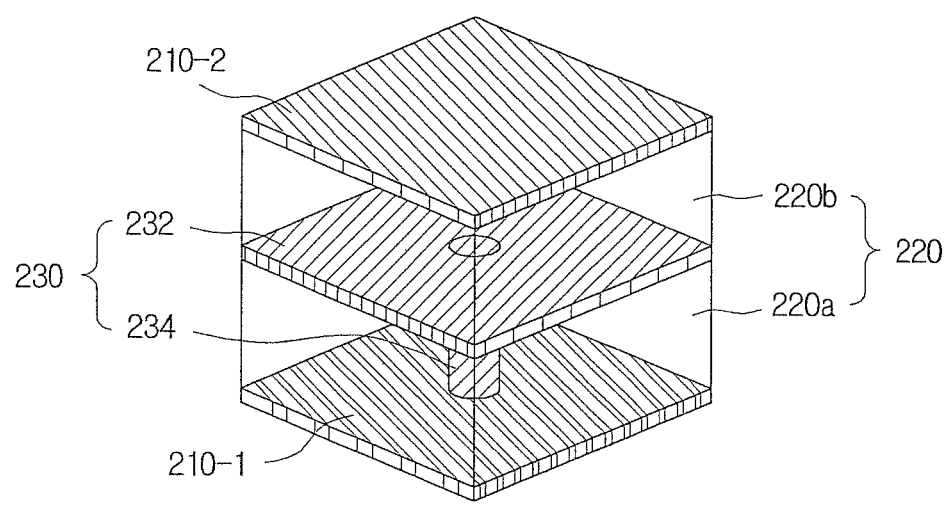
FIG. 4 is a perspective view showing the electromagnetic bandgap structure shown in FIG. 2.

As such, in the electromagnetic bandgap structure, if the structure connecting any one metal layer to another layer of 3 metal layers by additionally having the second via 360 (i.e. the structure having one more ground layer (or power layer), and hereinafter, referred to as ground layer adding structure) is used, the inductance value can be acquired more enough corresponding to the added second via 360, to thereby lower the bandgap frequency band as compared with the conventional structure (refer to FIG. 4). This will be described more clearly with reference to FIG. 10.

As described above, the electromagnetic bandgap structure 300 of the present invention can be arranged inside the printed circuit board having the analog circuit and the digital circuit. In other words, in accordance with an embodiment of the present invention, the printed circuit board can have the analog circuit and the digital circuit. At this time, the analog circuit can be the RF circuit such as an antenna receiving a wireless signal from an outside.

Figure 1:
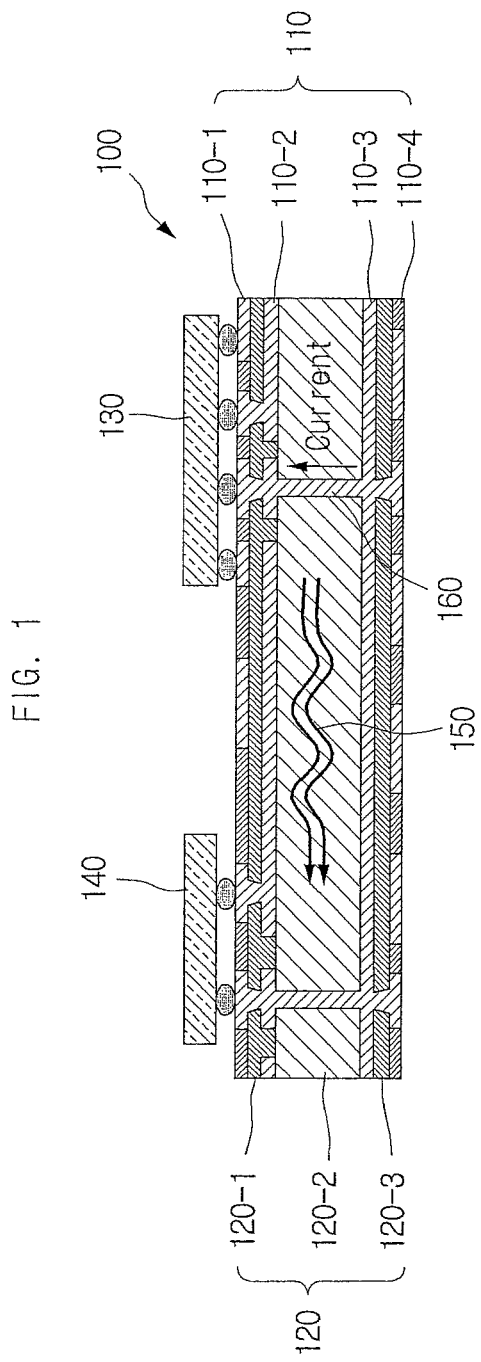
FIG. 1 is a sectional view showing a printed circuit board including analog circuit and a digital circuit.
Figure 2:
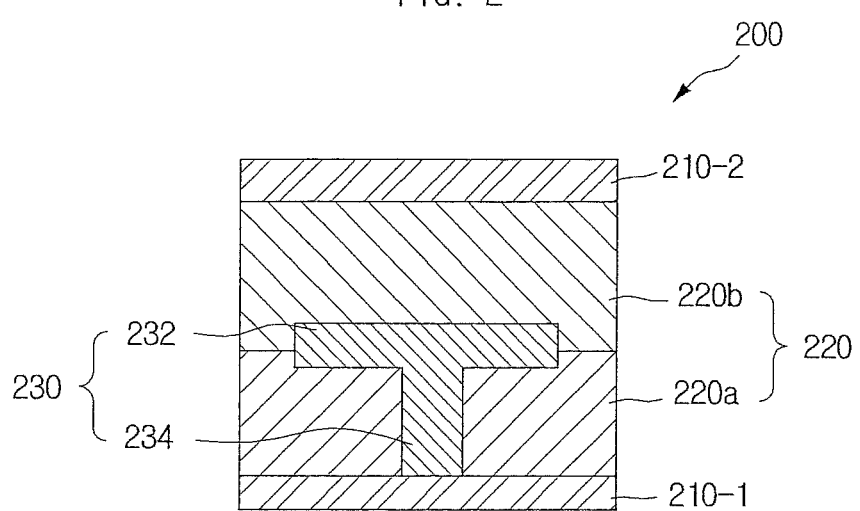
FIG. 2 is a sectional view showing an electromagnetic bandgap structure that solves a problem mixed signals between an analog circuit and a digital circuit in accordance with a conventional art.
Figure 3:
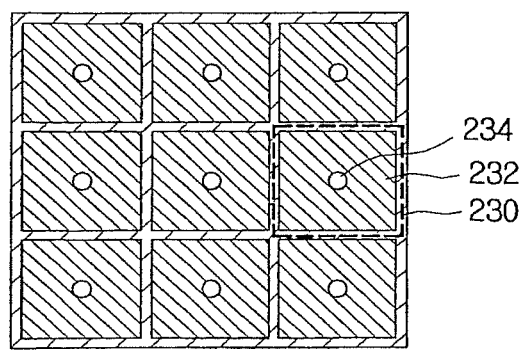
FIG. 3 is a plan view showing a metal plate configuration of the electromagnetic bandgap structure shown in FIG. 2.

In the printed circuit board of the present invention, the electromagnetic bandgap structure 300 illustrated in FIG. 6 and FIG. 7 can be arranged between the analog circuit and the digital circuit. For example, the electromagnetic bandgap structure 300 can be arranged between the RF circuit 140 and the digital circuit 130 of the printed circuit board illustrated in FIG. 1. This is to block an electromagnetic wave having a frequency band which is similar to the operation frequency band (e.g. 0.8~2.0 GHz) of the RF circuit 140 among the transferred electromagnetic wave by arranging the electromagnetic bandgap structure 300 to allow the electromagnetic wave generated from the digital circuit 130 to necessarily pass through the electromagnetic bandgap structure 300 before being transferred to the RF circuit 140.

Accordingly, the electromagnetic bandgap structure 300 of the present invention can be arranged in a closed curve shape about the RF circuit 140 and the digital circuit 130. Alternatively, the electromagnetic bandgap structure 300 can be arranged in a signal transferring path between the digital circuit and the analog circuit. It is obvious that the electromagnetic bandgap structure 300 can be arranged in various ways.

As described above, arranging the electromagnetic bandgap structure 300 inside the printed circuit board can make it possible to prevent an electromagnetic wave having a frequency band of the electromagnetic wave transferred from the digital circuit to the analog circuit from being transferred. This can solve the mixed signal problem.

FIG. 10 is graphs showing results that are computer-simulated by using electromagnetic bandgap structures in accordance with a conventional art and an embodiment of the present invention.

FIG. 10 and the below table 1 show computer-simulated results that compare the case of the conventional electromagnetic bandgap structure 200 (refer to (a) of FIG. 10) with the case of the electromagnetic bandgap structure 300 of the present invention (refer to (b) of FIG. 10).

Here, FIG. 10 and the below table 1 assume that the conventional electromagnetic bandgap structure 200 and the electromagnetic bandgap structure 300 of the present invention have the same size and the same configuration. However, it must be understood clearly that despite the same design condition, FIG. 10 and the below table 1 is merely examples showing that the simple design change into the ground layer adding structure such as the electromagnetic bandgap structure 300 of the present invention can makes it possible to lower the bandgap frequency bandgap band largely as compared with the conventional electromagnetic bandgap structure 200.

Accordingly, in the present invention, it is natural that adjusting various conditions such as the shape and size of the structure, and the thickness, dielectric constant and configuration of each element appropriately can design the electromagnetic bandgap structure to have a lower bandgap frequency band than the bandgap frequency bands shown in FIG. 10 and the following table 1.

TABLE 1

|  | Conventional structure (shown in FIG. 4) | Structure of invention (shown in FIG. 6) |
|---|---|---|
| Bandgap frequency (on a (−)60 dB basis) | 1.7 GHz~3.1 GHz | 1.4 GHz~2.7 GHz |

Figure 5:
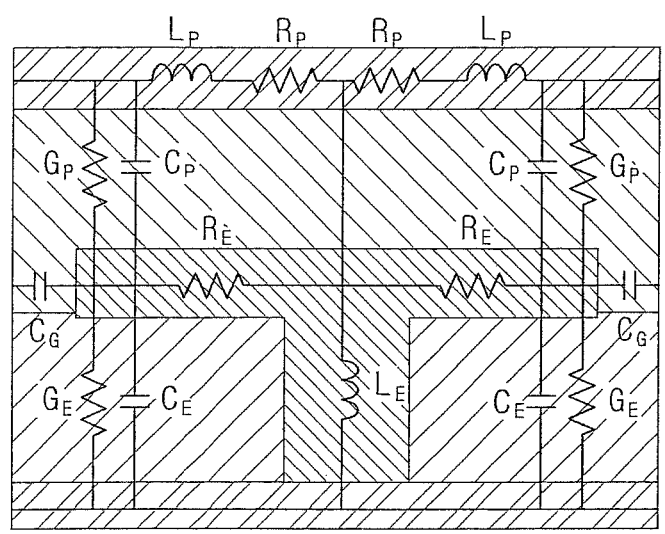
FIG. 5 is a schematic view showing an equivalent circuit of the electromagnetic bandgap structure shown in FIG. 2.

Referring to FIG. 8 and table 1, although the conventional electromagnetic bandgap structure 200 and the electromagnetic bandgap structure 300 of the present invention have the same design conditions such as the size of the structure, it can be recognized that the electromagnetic bandgap structure 300 of the present invention has the bandgap frequency band that is lower than approximately 0.3 to 0.4 GHz or more as compared with the conventional electromagnetic bandgap structure. This can be because the electromagnetic bandgap structure 300 of the present invention has the structure in which has one more ground layer or power layer by connecting one to another of three metal layers through the second via 360 in addition to arranging the electromagnetic bandgap structure 370. This can be described below with reference to the equivalent circuit of FIG. 5.

The electromagnetic bandgap structure 300 of the present invention can acquire an inductance component corresponding to the lengthwise direction of the second via 360 (refer to LE component by the via 234 of FIG. 5) more as compared with the conventional electromagnetic bandgap structure 200 due to having the ground layer adding structure through the second via 360. As such, the bandgap frequency band blocked through the electromagnetic bandgap structure 300 of the present invention by the inductance value additionally acquired by the second via 360 can be lowered as compared with the conventional structure. Accordingly, if the electromagnetic bandgap structure 300 having the ground layer adding structure like the present invention forms a lot of second vias 360 connecting metal layers, since the acquired inductance value is increased, it can be easily recognized that it is possible to lower the bandgap frequency band more largely.

As described above, when manufacturing the electromagnetic bandgap structure, the present invention can lower the bandgap frequency band more or select a desired bandgap frequency band by simply changing the configuration by the method of adding the second metal layer 210-2 and the second via 360 without the design process of minutely adjusting or changing the size, quantity and material of the structure to lower the bandgap frequency band.

FIG. 11A through FIG. 11E illustrate various configuration types of a second via connecting a second metal layer to a third metal layer in an electromagnetic bandgap structure. In particular, FIG. 11A through FIG. 11E illustrate that a plurality of second vias 360 are symmetrically arranged (or formed) based on the first via 340 as a reference axis. However, it shall be obvious that the configuration of the second via 360 is not limited to the foresaid description and it is unnecessary to symmetrically arrange the second vias 360 based on the first via 340 as the reference axis.

FIG. 12A through FIG. 12C are graphs showing results that are computer-simulated by using electromagnetic bandgap structures in accordance with a conventional art and an embodiment of the present invention according to each configuration type of the second via shown in FIG. 11A through FIG. 11E. Refer to FIG. 12A through FIG. 12C, it can be recognized that the electromagnetic bandgap structure 300 of the present invention according to configuration shown in FIG. 11A through FIG. 11E has the bandgap frequency band of approximately 1.0 to 2.5 GHz or so on a (−) 50 dB basis (refer to (a) through (e) of FIG. 12A through FIG. 12C). However, the conventional electromagnetic bandgap structure 200 has the bandgap frequency band of approximately 1.5 to 3.5 GHz or so on the (−) 50 dB basis (refer to (f) of FIG. 12C). Accordingly, it is recognized again that the electromagnetic bandgap structure 300 of the present invention can lower the bandgap frequency band due to having the ground layer adding structure as compared with the conventional structure.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalent.

What is claimed is:

1. A printed circuit board having an analog circuit and a digital circuit, the printed circuit board in which an electromagnetic bandgap structure is disposed between the analog circuit and the digital circuit, the electromagnetic bandgap structure comprising:
    a first metal layer;
    a first dielectric layer, stacked in the first metal layer;
    a second metal layer, stacked in the first dielectric layer, and having a hole formed at a predetermined position;
    a second dielectric layer, stacked in the second metal layer;
    a metal plate, stacked in the second dielectric layer;
    a first via, penetrating the hole formed in the second metal layer and connecting the first metal layer and the metal plate;
    a third dielectric layer, stacked in the metal plate and the second dielectric layer;
    a third metal layer, stacked in the third dielectric layer; and
    a second via, connecting the second metal layer to the third metal layer,
    wherein the second metal layer has a greater area than the metal plate,
    wherein a plurality of second vias are formed,
    wherein the plurality of second vias connect the second metal layer to the third metal layer through an area excluding the area in which the metal plate is stacked,
    wherein the first via is only extended from the first metal layer to the metal plate such that the metal plate and the first via form a mushroom type structure,
    wherein the second vias are only extended from the second metal layer to the third metal layer,
    wherein a plurality of metal plates are formed, and the plurality of metal plates are separated from one another, and
    wherein a plurality of mushroom type structures are placed between the first metal layer and the third metal layer.

2. The printed circuit board of claim 1, wherein the first metal layer is any one of a ground layer and a power layer, and the second metal layer and the third metal layer are the other.

3. The printed circuit board of claim 1, wherein
    the plurality of second vias are symmetrically formed based on the first via as a reference axis.

4. The printed circuit board of claim 1, wherein the first via is formed to have an identical center axis to the hole, and
    wherein a diameter of the hole is set to be larger than a diameter of the first via.

5. The printed circuit board of claim 1, wherein
    a plurality of holes are formed in the second metal layer, according to a position of each first via of the mushroom type structures.

6. The printed circuit board of claim 5, wherein the plurality of holes are formed to be away from each other at regular intervals.

7. The printed circuit board of claim 5, wherein the metal layers of the plurality of mushroom type structures are placed on a same planar surface.

8. The printed circuit board of claim 1, wherein the third dielectric layer is formed by using an identical dielectric material to the second dielectric layer.

9. The printed circuit board of claim 1, wherein the analog circuit is an RF circuit receiving a wireless signal from an outside.

* * * * *